United States Patent [19]
Tokura et al.

[11] Patent Number: 4,962,411
[45] Date of Patent: Oct. 9, 1990

[54] SEMICONDUCTOR DEVICE WITH CURRENT DETECTING FUNCTION

[75] Inventors: Norihito Tokura, Aichi; Hironari Kuno; Hiroyasu Ito, both of Kariya; Hirohiko Saito, Obu; Kunihiko Hara, Aichi, all of Japan

[73] Assignee: Nippondenso Co., Ltd., Kariya, Japan

[21] Appl. No.: 307,177

[22] Filed: Feb. 3, 1989

Related U.S. Application Data

[63] Continuation of Ser. No. 28,318, Mar. 20, 1987, abandoned.

[30] Foreign Application Priority Data

Mar. 21, 1986 [JP] Japan .................................. 60-64511
Feb. 6, 1987 [JP] Japan .................................. 61-26969

[51] Int. Cl.⁵ ..................... H01L 29/78; H01L 29/72; H01L 29/34
[52] U.S. Cl. .................................. 357/23.4; 357/23.1; 357/23.14; 357/34; 357/41; 357/52
[58] Field of Search ...................... 357/23.4, 34, 23.1, 357/20, 35, 52, 23.14, 41

[56] References Cited

U.S. PATENT DOCUMENTS

| 4,072,975 | 2/1978 | Ishitani .............................. 357/23.4 |
| 4,402,003 | 8/1983 | Blanchard .......................... 357/23.4 |
| 4,605,948 | 8/1986 | Martinelli .............................. 357/34 |
| 4,612,449 | 9/1986 | Patalong ............................ 357/23.4 |
| 4,630,084 | 12/1986 | Tihanyi ............................. 357/23.4 |
| 4,691,223 | 9/1987 | Murakami et al. ..................... 357/34 |

FOREIGN PATENT DOCUMENTS

| 3200634 | 7/1983 | Fed. Rep. of Germany ..... 357/23.4 |
| 57-141965 | 9/1982 | Japan ................................. 357/23.4 |
| 58-42275 | 3/1983 | Japan ................................. 357/23.4 |
| 60-196974 | 10/1985 | Japan . |
| 61-296770 | 12/1986 | Japan ................................. 357/23.4 |

Primary Examiner—Andrew J. James
Assistant Examiner—Ngan V. Ngo
Attorney, Agent, or Firm—Cushman, Darby & Cushman

[57] ABSTRACT

A semiconductor device with a current detecting function in which in place of an external resistor for detecting an operation current such as drain current or collector current of a device such as an FET or bipolar transistor, a probe electrode is formed in proximity to the device depletion layer to connect therethrough with the device channel to generate a probe voltage corresponding to the operation current.

15 Claims, 5 Drawing Sheets

FIG. 3
PRIOR ART (1) GATE VOLTAGE $V_G$ (2) DRAIN CURRENT $I_D$ (3) DRAIN-SOURCE VOLTAGE $V_{DS}$ (4) SOURCE VOLTAGE (VOLTAGE DROP ACROSS RESISTOR 57) $V_{sg}$

SEMICONDUCTOR DEVICE WITH CURRENT DETECTING FUNCTION

This is a continuation of application No. 07/028,318, filed Mar. 20, 1987, which was abandoned upon the filing hereof.

BACKGROUND OF THE INVENTION

1. Field of the Invention

The present invention relates to a semiconductor device having a function of detecting current flowing therethrough.

2. Description of the Prior Art

Figure 1:
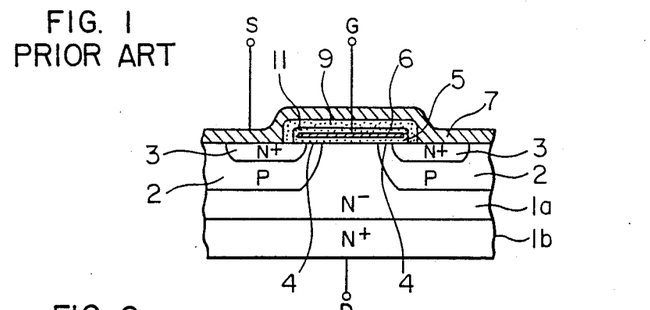
FIG. 1 is a sectional view of a conventional vertical MOSFET.

A conventional vertical MOSFET (metal oxide semiconductor field effect transistor) of what is called a double-diffusion type is shown in FIG. 1. In FIG. 1, an N+-type silicon substrate 1b of a high impurity concentration has an upper surface on which an N−-type silicon substrate 1a of a low impurity concentration is laid to make up a drain. A P-type region 2 is diffused at a predetermined interval in a predetermined region in the N−-type silicon substrate 1a, and a source electrode 7 is electrically connected to the P-type region 2 thereby to diffuse an N+-type region 3 of a comparatively high impurity concentration. Using as a channel 4 a portion around the surface of the P-type region 2 not formed with the N+-type region 3, a gate electrode 6 of polycrystalline silicon or the like is formed at least on the channel 4 through an insulating film 5 made of $SiO_2$ or the like. The gate electrode 6 is covered with an insulating film 11 formed by an oxidization. Further, the whole upper surface is covered by an interlayer insulating film 9. At the same time, the source electrode 7 made of an aluminum film or the like is formed on the surface of the N+-type region 3, P-type region 2 and the interlayer insulating film 9.

Figure 2:
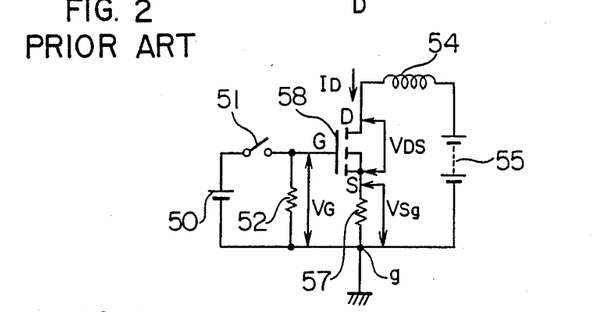
FIG. 2 is a diagram showing an electrical circuit using a MOSFET as in FIG. 1.

In the prior art, the drain current or source current of the MOSFET (meaning operation current hereinafter referred to as "the drain current" uniformly) is detected by the voltage drop that occurs across a current-detecting resistor connected to the source electrode 7. The manner of detecting the drain current will be explained with reference to FIGS. 2 and 3. In an electrical circuit using the MOSFET as shown in FIG. 2, for example, the source terminal S is connected through a current detecting resistor 57 to a ground node g, and the drain current $I_D$ is detectable by a voltage drop $V_{sg}$ through the current detecting resistor 57. Specifically, the relationship $$I_D = \frac{V_{sg}}{R_{57}} \quad (1)$$

(where $R_{57}$ is the resistance value of the current detecting resistor 57) is used to determine the drain current $I_D$.

Figure 3:
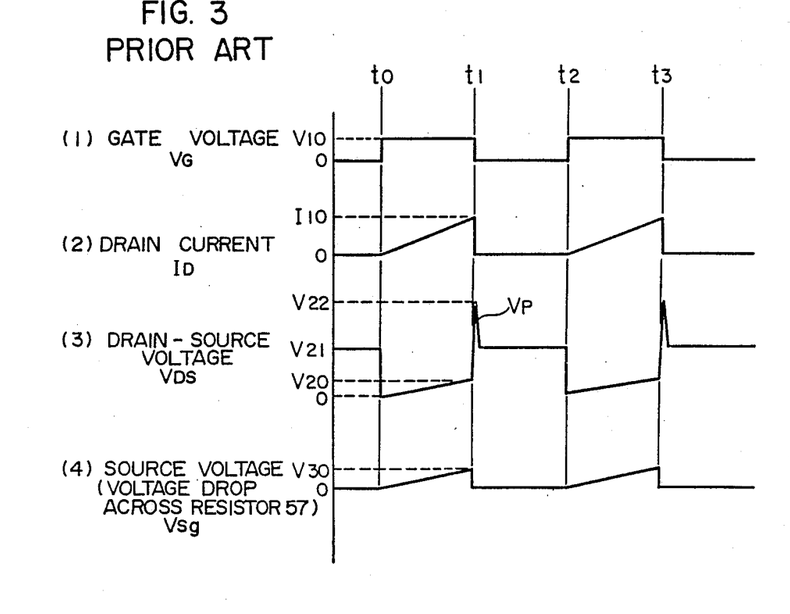
FIG. 3 shows waveforms for explaining the operation of the electrical circuit in FIG. 2.

Now, the operation of the circuit in FIG. 2 will be explained with reference to the waveform diagram of FIG. 3. When a switch 51 is turned on and off in predetermined cycles, the applied gate voltage $V_G$ assumes the values of 0 and $V_{10}$ alternately (FIG. 3(1)). When $V_G = 0$, the MOSFET 58 turns off, and when $V_G = V_{10}$, a conduction path is formed in the channel 4 to turn on the MOSFET 58. As a result of this on-off operation, the drain current $I_D$ flows through an inductance 54 and the current detecting resistor 57 as a load as shown in FIG. 3(2). The waveforms of the voltage drop $V_{sg}$ across the current detecting resistor 57 (FIG. 3(4)) and that of the drain current $I_D$ are similar to each other as seen from the proportional relationship indicated by equation (1), thus making it possible to detect the drain current $I_D$. In FIG. 2, numeral 50 designates a DC power supply, and numeral 52 a resistor for reducing the gate applied voltage $V_G$ to zero when the switch 51 is open.

The conventional device using the current detecting resistor 57 shown in FIG. 2, however, has the disadvantages described below.

(1) The resistor 57 is required for detecting the current, increasing the size of the electronic device as well as the number of parts required, thereby leading to an increased cost.

(2) The current detecting resistor 57, which generates Joule's heat, is required to be cooled. (3) The voltage drop across the current detecting resistor 57 hampers the effective utilization of the power voltage.

In prior art methods, in order to prevent these disadvantages, the on resistance of the MOSFET without any current detecting resistor is used to detect the drain current $I_D$ from the drain-source voltage $V_{DS}$. Specifically, the relationship $$I_D = \frac{V_{DS}}{R_{DS}} \quad (2)$$

(where $R_{DS}$ is the on resistance, that is, the drain-source path resistance with the MOSFET turned on) is used to determine the drain current $I_D$.

In FIG. 3, during the period when the drain-source path is in an on state (from $t_0$ to $t_1$, for instance), the waveform of the drain-source voltage $V_{DS}$ (FIG. 3(3)) is similar to that of the waveform of the drain current $I_D$ as shown by the proportional relations specified by equation (2), making it possible to detect the drain current $I_D$.

Even this prior art method utilizing the on resistance has the problems mentioned below.

(1) As shown in FIG. 3(3), when the MOSFET 58 switches from on to off (such as at the time $t_1$), a flyback pulse $V_P$ of high voltage is generated due to the inductance 54.

(2) As also shown in FIG. 3(3), when the MOSFET 58 turns off (such as at the time from $t_1$ to $t_2$), the voltage $V_{21}$ of the DC power supply 55 is undesirably applied as the drain-source voltage $V_{DS}$.

These problems prevent accurate detection since the drain-source voltage $V_{DS}$ does not become zero when the drain current $I_D$ is zero. Another problem is that generation of such a high-voltage flyback pulse $V_P$ damages the electrical circuit for detecting the voltage $V_{DS}$ in an extreme case.

SUMMARY OF THE INVENTION

Accordingly, it is an object of the present invention to provide a semiconductor device having a current detecting function which has been developed for obviating the above-mentioned problems to produce a detection signal corresponding to an operation current at the time of operating the device and to reduce the magnitude of the detection signal to substantially zero at the time of not operating the device without any external current detecting resistor.

In order to achieve the above-mentioned object, there is provided according to the present invention a semiconductor device with a current detecting function, comprising a semiconductor substrate of a first conductivity type, a diffusion layer of a second conductivity type formed in a predetermined region on the main surface side of the semiconductor substrate, a diffusion layer of the first conductivity type formed in the diffusion layer of the second conductivity type, and a probe electrode formed in an isolated manner in the diffusion layer of the second conductivity type on the main surface of the semiconductor substrate and electrically connected to the semiconductor substrate to detect a signal corresponding to the operation current.

DESCRIPTION OF THE PREFERRED EMBODIMENTS

Figure 4:
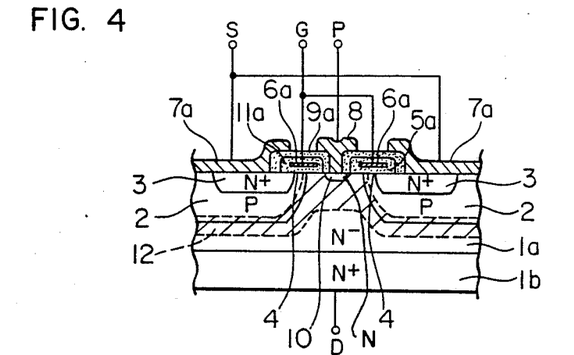
FIG. 4 is a sectional view showing a first embodiment using a vertical MOSFET according to the present invention.

FIG. 4 is a sectional view of a first embodiment of the present invention using a vertical MOSFET. In FIG. 4, the same component parts of the MOSFET as in FIG. 1 are designated by the same reference numerals as in FIG. 1 and will not be described herein. Numeral 10 designates a probe region higher in impurity concentration than the N⁻-type silicon substrate portion 1a, and region 10 is diffused to a predetermined depth in the N⁻-type silicon substrate portion 1a between P-type regions 2 or in the N⁻-type silicon substrate portion 1a around the elements (the drawing shows the former). A probe electrode 8 made of an aluminum film or the like is formed in electrical connection with the probe region 10. Since these two portions are formed, the configuration on the main surface is different from that in FIG. 1. A gate electrode 6a is formed at least on a channel 4 at a part not covering the probe region 10 through an insulating film 5a, and an insulating film 11a and an interlayer insulating film 9a cover the particular part alone. Source electrode 7a is formed on the surface of N⁺-type region 3, P-type region 2 and the interlayer insulating film 9. The effect of the present invention is obtained by forming the probe electrode 8 even if the probe region 10 is not formed. If the probe region 10 is formed, however, the contact characteristic of the probe electrode 8 is improved.

Figure 5:
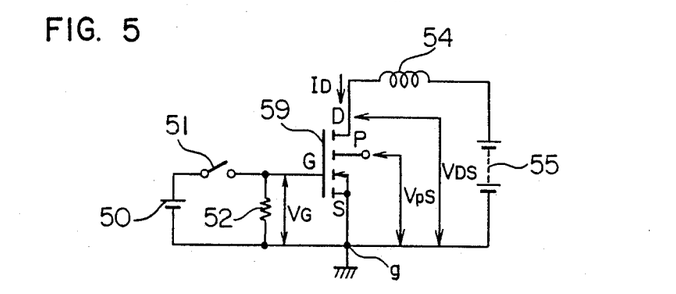
FIG. 5 is a diagram showing an electrical circuit using the MOSFET of FIG. 4.

Now, the manner in which the drain current is detected in the MOSFET having the configuration described above will be explained with reference to FIGS. 5 and 6. FIG. 5 shows an electrical circuit using the above-mentioned MOSFET. In FIG. 5, the same portions having the same reference numerals as in FIG. 2 are designated by the same reference numerals as in the latter and will not be described. Numeral 59 designates a MOSFET according to the present embodiment having four terminals of drain D, gate G, source S and a probe P which is equivalent to the probe electrode 8 described above.

Now, the operation of the electrical circuit shown in FIG. 5 will be described with reference to the waveforms of FIG. 6. Assume that the switch 51 turns on from off at time point $t_0$. The gate applied voltage $V_G$ in FIG. 6(1) changes from 0 to $V_{10}$, which is a voltage set sufficiently high to turn on the MOSFET 59. At time point $t_0$, the MOSFET 59 turns on from off. The drain current $I_D$ shown in FIG. 6(2) increases linearly with time lapse from 0 after the time point $t_0$. In this embodiment, the MOSFET 59 is of the N-channel type, and therefore, the carriers of the drain current $I_D$ are electrons which flow from the source terminal S toward the drain terminal D. In FIG. 4, the electrons that have flowed into the channel 4 from the N⁺-type region 3 pass near the probe region 10 and through the N⁻-type silicon substrate 1a and the N⁺-type silicon substrate 1b to reach the drain D. A voltage drop that occurs when electrons pass the channel 4 appears as a potential difference $V_{PS}$ between the probe region 10 and the N⁺-type region 3. More specifically, the probe-source voltage $V_{PS}$ is expressed by the equation shown below with a channel resistance $R_{ch}$ and drain current $I_D$.

$$V_{PS} = I_D \times R_{ch} \tag{3}$$

Figure 6:
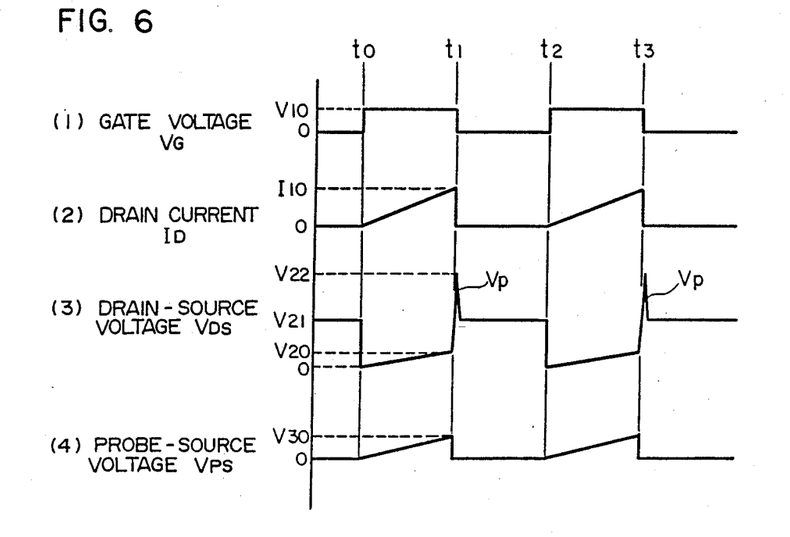
FIG. 6 shows waveforms for explaining the operation of the electrical circuit in FIG. 5.

The channel resistance $R_{ch}$ is constant, and therefore, from equation (3), $V_{PS}$ is proportional to $I_D$, and the waveforms of $V_{PS}$ and $I_D$ are similar to each other during the period when the MOSFET 59 is kept on (from $t_0$ to $t_1$, for instance), as shown in FIGS. 6(2) and (4). As a result, once the probe-source voltage $V_{PS}$ is measured, the drain current $I_D$ is detected by use of equation (3).

Assume that the switch 51 turns off from on at time point $t_1$. The gate applied voltage $V_G$ shown in FIG. 6(1) changes from $V_{10}$ to 0. In this embodiment, the MOSFET 59 is assumed to be of the enhancement type and turns off when $V_G=0$, so that it turns from on to off at time point $t_1$. As a consequence, the drain current $I_D$, after assuming the maximum value $I_{10}$ at time point $t_1$, sharply falls. Also, the drain-source voltage $V_{DS}$ shown in FIG. 6(3) sharply increases from 0 to $V_{20}$, and after generation of the flyback pulse $V_P$, drops to and stabilizes at the voltage $V_{21}$ of the DC power supply 55. In other words, in spite of the fact that the drain-source voltage $V_{DS}$ takes a high value at and after time $t_1$, as shown in FIG. 4, a depletion layer 12 formed at the PN junction between the N⁻-type silicon substrate portion 1a and the P-type region 2 extends mainly in the N⁻-type silicon substrate portion 1a and electrically insulates the probe region 10 from the surroundings thereof. Therefore, during the period from $t_1$ to $t_2$, for example, the probe-source voltage $V_{PS}$ shown in FIG. 6(4) becomes zero. The impurity concentration of the $N^-$-type silicon substrate portion 1a is preferably sufficiently low to enable the depletion layer 12 to fully cover the probe region 10. Alternatively, the spacings of the P-type regions 2 may be narrowed.

As explained above, according to the first embodiment, the probe-source voltage $V_{PS}$ is exactly proportional to the drain current $I_D$, so that when the drain current $I_D$ is zero, the probe-source voltage $V_{PS}$ becomes zero due to the insulation effect of the depletion layer 12 even if the drain-source voltage $V_{DS}$ is not zero, thus making possible accurate detection of the drain current $I_D$.

Figure 7:
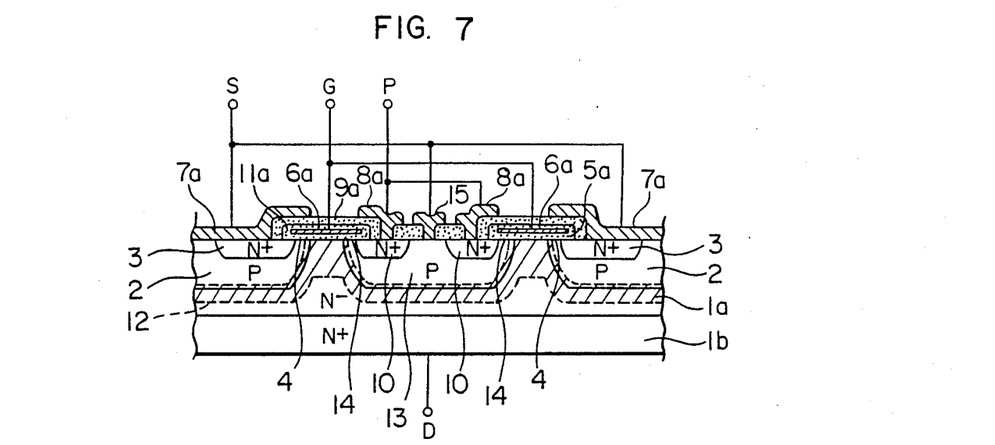
FIG. 7 is a sectional view of a second embodiment shown as a modification of the first embodiment.

A sectional view of a second embodiment is shown in FIG. 7 as a further development of the first embodiment. In FIG. 7, those portions corresponding to like portions in FIG. 4 are designated by the same reference numerals and additional or different portions are designated by additional reference numerals. Specifically, a P-type shield region 13 is diffused into a portion isolated between the P-type regions 2 in the surface of the $N^-$-type silicon substrate portion 1a, and probe regions 10 are formed in the P-type shield region 13. Probe channels 14 are formed of portions near the surface of the P-type shield region 13 not formed with the probe region 10, on which a gate electrode 6a of polycrystalline silicon or the like is extended from the channels 4 over the probe channels 14 through an insulating film 5a of $SiO_2$ or the like. At the same time, a shield electrode 15 of aluminum film or the like is formed on the surface of the P-type shield region 13, and a probe electrode 8a of aluminum film or the like is formed on the surface of the probe region 10 in such a manner as to electrically insulate the electrodes thereof from each other. The shield electrode 15 is electrically connected to the source electrode 7a. The P-type shield region 13 may be formed by the same diffusion process for and at the same time as the P-type region 2.

This second embodiment produces the same effect as the above-mentioned first embodiment, as explained in detail below with reference to FIGS. 5 to 7. The MOSFET 59 in FIG. 5 is now assumed to be the same as the MOSFET of the second embodiment shown in FIG. 7. In the description of FIGS. 5 and 6, those portions already explained with reference to the first embodiment will not be explained again.

As in the first embodiment, at time point $t_0$ when switch 51 turns on from off, the gate electrode 6a is impressed with the voltage $V_{10}$ to turn on the MOSFET 59, and a conduction path is formed in the channel 4, thus causing the drain current $I_D$ to flow. In the MOSFET 59 shown in FIG. 7, the carriers of the drain current $I_D$ are electrons, which flow into the channel 4 from the $N^+$-type region 3, and after passing through the channel 4, reach the $N^-$-type silicon substrate portion 1a. Then, the electrons change their direction just under the gate electrode 6a toward the $N^+$-type silicon substrate portion 1b so as to sequentially pass through the $N^-$-type silicon substrate portion 1a, and $N^+$-type silicon substrate portion 1b to reach the drain D.

When the gate electrode 6a is impressed with the voltage $V_{10}$, the gate electrode 6a turns on not only the channel 4 but also the probe channel 14, thereby making it possible for the probe region 10 to detect the potential of the portion just under the gate 6a of the $N^-$-type silicon substrate portion 1a through the probe channel 14. More specifically, the potential of the electrons that flowed into the $N^-$-type silicon substrate portion 1a from the channel 4 can be detected by the probe region 10. As in the first embodiment described above, a voltage drop that occurs when electrons pass the channel 4 appears as a potential difference $V_{PS}$ between the probe region 10 and the $N^+$-type region 3, thus permitting the drain current $I_D$ to be detected from $V_{PS}$.

Now, assume that the switch 51 turns from on to off at time point $t_1$. The voltage applied to the gate electrode 6a becomes zero, and the MOSFET 59 turns off. The conduction path of the channel 4 is thus extinguished to block the current conduction, and therefore the drain current $I_D$ is sharply reduced to zero. From time $t_1$ and after (between $t_1$ and $t_2$), the drain current $I_D$ thus remains at zero. When the voltage applied to the gate electrode 6a becomes zero, the gate electrode 6a extinguishes the electrically conductive paths of the probe channel 14 as well as the channel 4 thereby to block conduction therein. More specifically, during the period from $t_1$ to $t_2$, the probe region 10 loses the conduction path for electrical connection with the $N^-$-type silicon substrate portion 1a, and is electrically insulated from the surrounding portions by the shield electrode 15 (P-type shield region 13) electrically connected to the source electrode 7a ($N^+$-type region 3). As a result, the potential difference $V_{PS}$ between the probe region 10 and the $N^+$-type region 3 is reduced to zero during the period from $t_1$ to $t_2$ as shown in FIG. 6(4). The probe region 10 is insulated from the drain 10 in a double way by the depletion layer 12 and the P-type shield region 13, and, therefore the effect of insulation according to the second embodiment is higher than in the first embodiment with the insulation effected only by the depletion layer 12, thereby reducing the potential differential $V_{PS}$ to zero without fail during the period from $t_1$ to $t_2$.

As explained above, according to the second embodiment, the probe-source voltage is faithfully proportional to the drain current $I_D$. When the drain current $I_D$ is zero, therefore, even if the drain-source voltage $V_{DS}$ is not zero, the probe-source voltage $V_{PS}$ is reduced to zero by the insulation effect of the depletion layer 12 and the P-type shield region 13, thus making possible accurate detection of the drain current $I_D$.

Further, according to the second embodiment, in view of the fact that the shield electrode 15 is electrically connected to the source electrode 7a held at the ground potential, possible leak currents and effects of the drain potential which otherwise might be had due to stray capacitance existing between the P-type shield region 13 and the drain D are bypassed through their electrical paths and they are not exerted on the probe electrode 8a. The device is thus operated successfully even with high impedances for high-sensitivity detection. In the second embodiment, the P-type shield region 13, which may be formed of the same size as the P-type region 2 by the same diffusion process, is not confined dimensionally in any manner.

Figure 8:
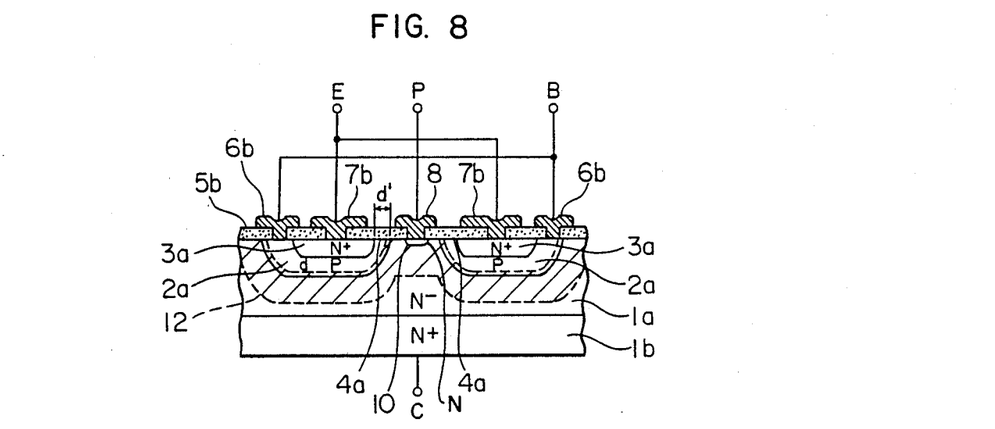
FIG. 8 is a sectional view of a third embodiment of the present invention applied to a vertical bipolar transistor.

FIG. 8 is a sectional view showing a third embodiment of the present invention applied to a vertical bipolar transistor (BPT). In the embodiment shown in FIG. 8, an $N^-$-type silicon substrate portion 1a and an $N^+$-type silicon substrate portion 1b make up a collector, and a base is formed by diffusing a P-type region 2a at predetermined intervals in a predetermined region in the $N^-$-type silicon substrate portion 1a, the P-type region 2a being electrically connected to the base electrode 6b. An $N^+$-type region 3a electrically connected to the emitter electrode 7b and comparatively high in impurity concentration is diffused in the P-type region 2 to make up an emitter. The thickness d' of surface portion 4a of the P-type region 2a is smaller than the thickness d of its bottom portion for the reason described herein later. On the other hand, a probe region 10 is formed by diffusion to a predetermined depth in the N⁻-type silicon substrate portion 1a between the P-type regions 2a or in the N⁻-type silicon substrate portion 1a in the device peripheral portion (the former shown) and with an impurity concentration higher than that of the N⁻-type silicon substrate portion 1a. Also, the probe electrode 8 made of an aluminum film or the like is connected electrically to the probe region 10 thereof. Numeral 5b designates an insulating film made of an oxidized Si film or the like.

Figure 9:
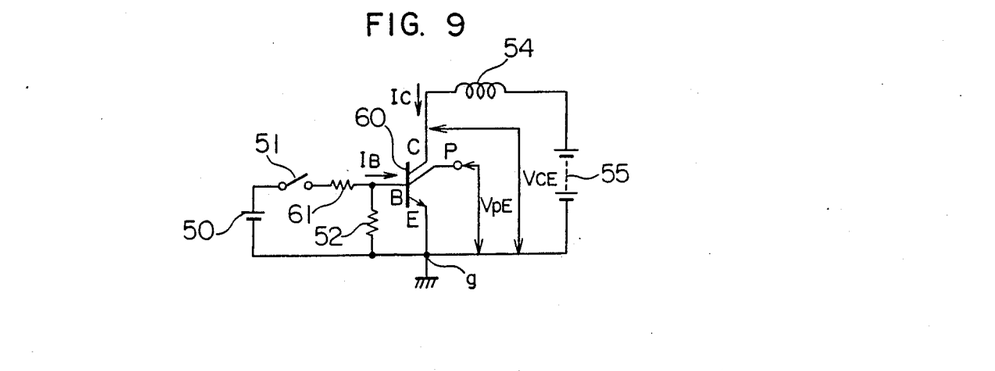
FIG. 9 is a diagram showing an electrical circuit using the bipolar transistor in FIG. 8.

Now, the manner in which a collector- current (named as "operation current" in this specification) is detected according to the embodiment under consideration will be explained with reference to FIGS. 9 and 10. FIG. 9 is a diagram showing an electrical circuit employing the BPT according to the third embodiment, in which the BPT is designated by numeral 60. Specifically, the BPT represents a semiconductor device having four terminals including the collector C, base B, emitter E and the probe P as a new terminal, the probe P indicating the probe electrode 8. The electrical circuit of FIG. 9 is configured in substantially the same manner as the electrical circuit of the first embodiment shown in FIG. 5, and those parts in FIG. 9 corresponding to those in FIG. 5 are designated by the same numerals and will not be explained. The only difference between these two embodiments are that the MOSFET 59 in the first embodiment is replaced by the BPT 60 in the third embodiment, and a base input resistor 61 is added in the circuit of the third embodiment.

Figure 10:
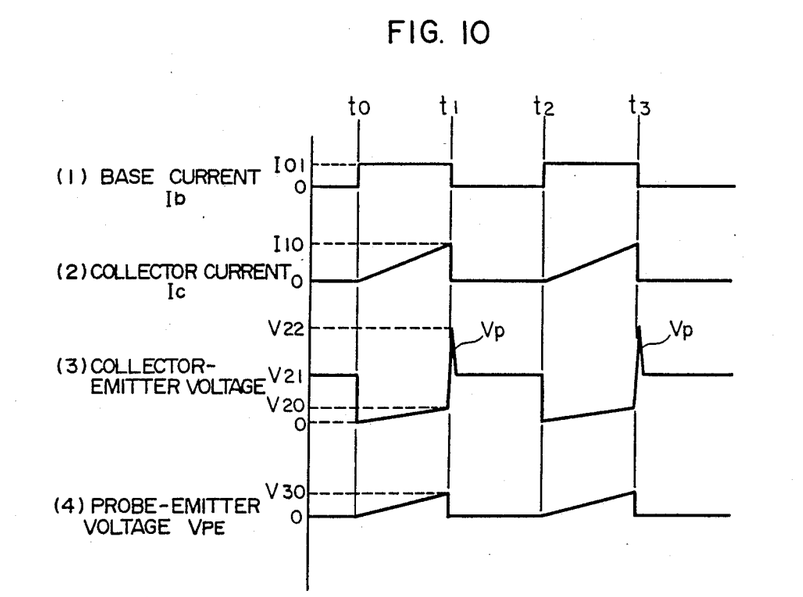
FIG. 10 shows waveforms for explaining the operation of the electrical circuit of FIG. 9.

Waveforms produced at various parts of the device configured as above are shown in FIG. 10. The waveforms of FIG. 10 are also similar to those for the first embodiment shown in FIG. 6, and the only difference is that the MOSFET 59 is replaced by the BPT 60 as a semiconductor, that the terminal names are changed, and that the gate applied voltage $V_G$ is used for control in the MOSFET 59, while the BPT 60 uses the base current $I_B$ for control. In the explanation of FIGS. 9 and 10, those parts also included in the first embodiment will not be described. Especially, as explained below, the probe-emitter voltage $V_{PE}$ of the BPT 60 assumes a waveform shown in FIG. 10(4), which is similar to the waveform of the collector current $I_C$ shown in FIG. 10(2), so that the collector current $I_C$ can be detected from the probe-emitter voltage $V_{PE}$.

In the BPT 60 shown in FIG. 8, electrons making up carriers are injected into the P-type region 2a from the N⁺-type region 3a, thereby reaching the N⁻-type silicon substrate portion 1a and the N⁺-type silicon substrate portion 1b. Portion 4a near the surface of the P-type region 2a has a thickness d' smaller than the thickness d of its lower portion near the bottom in order to facilitate the flow of current in the portion 4a near the surface. The portion d near the bottom is designed thicker in order to improve the BPT characteristics. The electrons that flow through the portion 4a near the surface are thus passed near the probe region 10. The voltage drop due to the conduction resistance $R_C$ (corresponding to the channel resistance $R_{ch}$ in the first embodiment) of the portion 4a near the surface is detected as the probe-emitter voltage $V_{PE}$. Since the probe-emitter voltage $V_{PE}$ holds the relations similar to equation (3) of the first embodiment ($V_{PE}=I_C \times R_C$ in the present embodiment), the collector current $I_C$ can be detected from the probe-emitter voltage $V_{PE}$. Also, in view of the fact that when the BPT 60 is off, the depletion layer 12 grows to such an extent that the probe region 10 is insulated electrically from the surrounding portions as shown in FIG. 8 in a manner similar to the first embodiment, the probe-emitter voltage $V_{PE}$ is reduced to zero.

As explained above, according to the third embodiment of the invention, the probe-emitter voltage $V_{PE}$ is proportional to the collector current $I_C$, so that when the collector current $I_C$ is zero, the insulation effect of the depletion layer 12 reduces the voltage $V_{PE}$ to zero even if the collector-emitter voltage $V_{CE}$ is not zero, thus making possible accurate detection of the collector current $I_C$.

In the third embodiment described above, if the probe region 10 is isolated electrically from the surrounding portions by the P-type shield region as shown in the second embodiment, more accurate detection of the collector current is made possible.

Now, a power transistor using a semiconductor with the current detection function according to the invention (power MOSFET, for instance) and a specific configuration of a signal processing circuit thereof will be described with reference to FIGS. 11 to 14.

Figure 11:
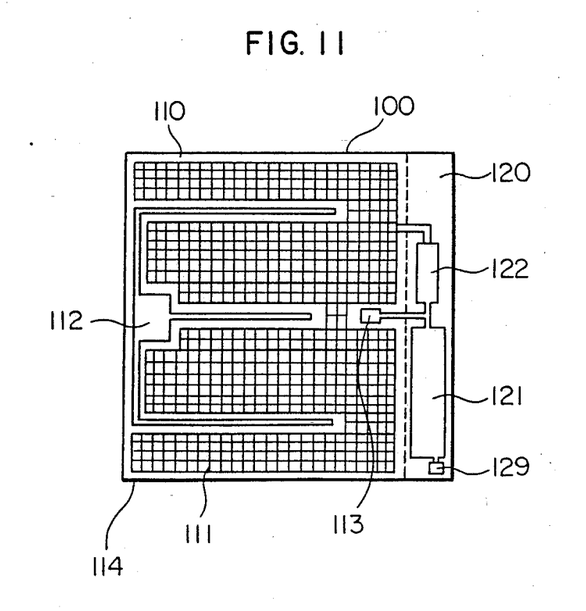
FIG. 11 is a top plan view of a specific example of the configuration of a power transistor and a signal processing circuit thereof.
Figure 12:
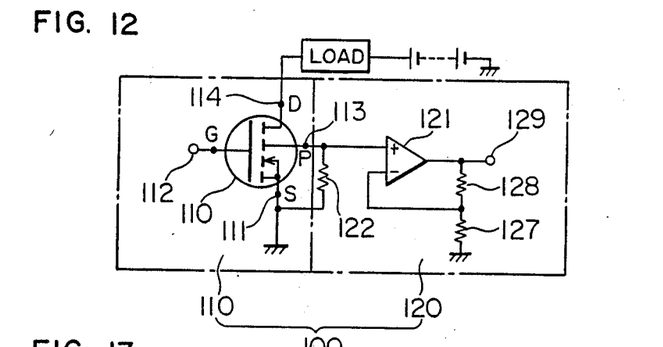
FIG. 12 is a diagram showing an equivalent circuit of FIG. 11.

FIGS. 11 and 12 show an example of a device having the function to amplify and produce a current signal detected by an operational amplifier. Of these drawings, FIG. 11 is a top plan view showing a specific arrangement of the elements according to the present embodiment, and FIG. 12 a diagram showing an equivalent circuit thereof.

As shown in FIGS. 11 and 12, a power control section 110 formed with a power MOSFET and a signal processing section 120 for amplifying and processing the signal from the power control section 110 are arranged on the same semiconductor substrate 100. An electrical signal generated between the source electrode 111 and the probe electrode 113 configured as shown in FIG. 1 or FIG. 8 is applied through a load resistor 122 to an operational amplifier 121, and after being amplified by an amplification factor determined by resistors 127, 128, is produced from an output terminal 129.

Figure 13:
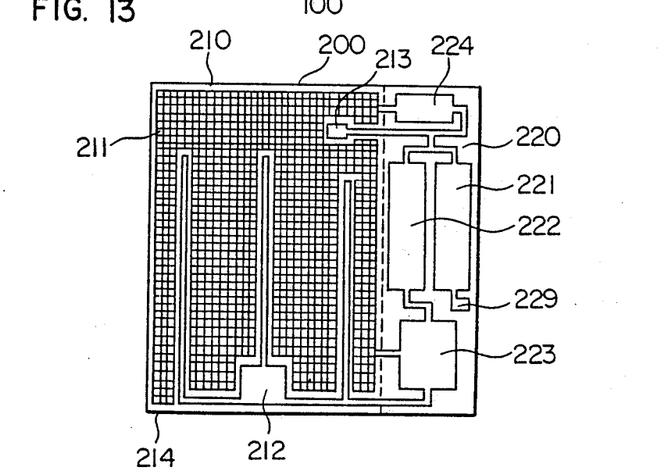
FIG. 13 is a top plan view of another example of a specific configuration of a power transistor and a signal processing circuit thereof.
Figure 14:
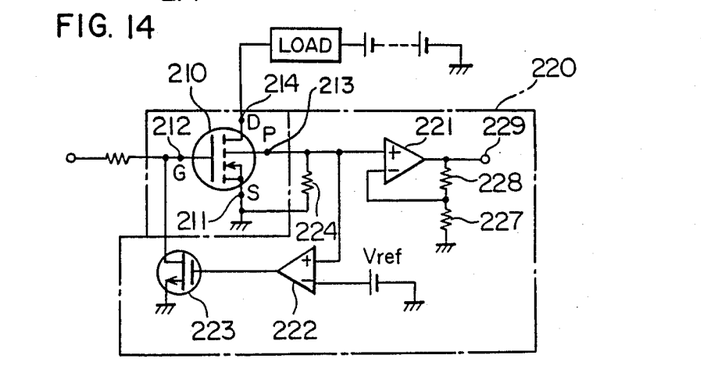
FIG. 14 is a diagram showing an equivalent circuit of FIG. 13.

FIGS. 13 and 14 show another example in which a current signal detected is amplified by an operational amplifier while at the same time being compared with a set value at a comparator. If the signal thus compared is larger than the set value, the device is turned off by itself to prevent damage of the elements thereof. FIG. 13 is a plan view showing a specific arrangement of the elements, and FIG. 14 a diagram showing an equivalent circuit thereof.

As shown in the drawings, a power control section 210 and a signal processing section 220 for amplifying and performing processes such as comparison of the signal are arranged on the same semiconductor substrate 200.

An electrical signal generated between the probe electrode 213 and the source electrode 211 is applied through a load resistor 224 to an operational amplifier 221 and a comparator 222. The signal is amplified by the operational amplifier at an amplification factor determined by resistors 227, 228 in a manner similar to the aforementioned case, and produced from an output terminal 229. In the case where the comparator 222 decides that the signal is larger than a current value set by a reference voltage $V_{ref}$, the output of the comparator 222 changes from "low" to "high" level, thereby turning on the MOS transistor 223. As a result, the operation of the power control section 210 is forcibly suspended by setting the gate electrode 212 thereof to ground potential in order to protect the device from damage. In FIGS. 11 to 14, numerals 112 designates a gate electrode, and numeral 114, 214 a drain electrode formed on the back of the semiconductor substrate.

The present invention which is described specifically above on the basis of the shown embodiments are not confined to these embodiments, but may of course be modified in various ways within the scope without departing from the spirit of the invention. The first and second embodiments which are of N-channel type are applicable with equal effect to the P-channel type. Also, the insulating film 5a may be made of other insulators such as $Si_3N_4$ or the like instead of an oxide. The third embodiment, which relates to NPN type, is also applicable to PNP type. Further, the present invention may be embodied in the form of a conduction-modulated MOSFET (JP-A-60-196974) with the $N^+$-type silicon substrate 1b replaced by a P-type silicon substrate.

It will be understood from the foregoing description that according to the present invention, there is provided a semiconductor device with a current detection function in which the operation current is detected from the voltage between a first electrode and a probe electrode, and therefore, a detection signal proportional to the operation current is produced without any external current detection resistor. Also, the current detection function reduces the detection signal accurately to zero at the time of non-conduction, making accurate current detection possible, with the result that the number of parts is reduced for a lower cost, and the semiconductor device is rendered less bulky at the same time.

Further, the elimination of Joule's heat which otherwise would be generated by a current detection resistor simplifies the heat radiation means. Since the voltage drop due to the current detection resistor is eliminated in addition, the source voltage is utilized effectively.

We claim:

1. A semiconductor device with means for detecting current flow through the device, comprising:
    a semiconductor substrate of a first conductivity type having first and second surfaces with drain and source electrodes, respectively;
    a first diffusion layer of a second conductivity type formed in a predetermined portion of said semiconductor substrate on the second surface side in the semiconductor substrate leaving a remaining portion of said semiconductor substrate;
    a second diffusion layer of the first conductivity type formed in the first diffusion layer of the second conductivity type and electrically connected to the source electrode;
    a gate electrode formed with an insulating film on the second surface of the substrate for controlling a current channel through the first diffusion layer in the vicinity of the second surface between said remaining portion of said semiconductor substrate of said first conductivity type and said second diffusion layer thereby configuring a vertical MISFET;
    means for controllably causing electric current to flow between the drain and source electrodes through the current channel; and
    current flow detecting means for detecting a signal representative of a source-drain current of said MISFET comprising a probe region of a third diffusion layer of the first conductivity type formed in the remaining portion of the substrate, and a probe electrode spaced from the first diffusion layer of the second conductivity type on the second surface side of the substrate and in electrical contact with the probe region.

2. A semiconductor device according to claim 1, wherein the remaining portion of the semiconductor substrate comprises a first substrate bottom layer of a high impurity concentration electrically connected to the drain electrode and at least a second substrate bottom layer of a low impurity concentration laid on the first substrate bottom layer.

3. A semiconductor device according to claim 2 wherein said probe region is formed by diffusion to a predetermined depth in the second substrate bottom layer under the probe electrode and has an impurity concentration higher than said second bottom layer.

4. A semiconductor device according to claim 3, further comprising a shield region of the second conductivity type diffused in the remaining portion of the substrate and electrically connected to the source electrode, the probe region being diffused in the shield region.

5. A transistor device with means for detecting a voltage signal representative of current flow through the device, comprising:
    a semiconductor substrate of a first conductivity type having first and second opposite surfaces and having first and second electrodes disposed on said first and second opposite surfaces, respectively;
    at least one first diffusion region of a second conductivity type diffused into the semiconductor substrate from the second opposite surface leaving at least one partial region of the semiconductor substrate adjacent to the first diffusion region, the partial region having a surface area in the second surface of said substrate;
    at least one second diffusion region of the first conductivity type diffused into the first diffusion regions from the second opposite surface leaving at least one partial region of the first diffusion region around the second diffusion region, said second diffusion region electrically connected to the second electrode;
    current control means for controlling electric current flowing through the second diffusion region, the partial region of the first diffusion region and the partial region of the semiconductor substrate between the first and the second electrodes by electrically controlling a current path of the partial region of the first diffusion region; and
    voltage signal detecting means for detecting the voltage signal representative of the current through the at least one partial region of the semiconductor substrate comprising:
        a probe electrode formed on the surface area of the partial region of the semiconductor substrate and near, but isolated from, the current path of the first diffusion region.

6. A transistor according to claim 5 wherein said voltage signal detecting means further comprises a probe region formed in the partial region of the semiconductor substrate and near the current path of the partial region of the first diffusion region, the probe region electrically contacting the probe electrode.

7. A transistor device according to claim 6, wherein the current causing means includes a control electrode for applying a control voltage to the partial region of the first diffusion region around the second diffusion region.

8. A transistor device according to claim 7, wherein the first electrode forms a drain electrode, the second electrodes form source electrodes, the partial region of the first diffusion region around the second diffusion region form a FET channel, and the control electrode forms a gate electrode with an insulating film therearound on at least the partial region of the first diffusion region, thereby forming a vertical-type MISFET with the probe region defined adjacent to the FET channel.

9. A transistor device according to claim 7, wherein the first electrode forms a collector electrode, the second electrodes form emitter electrodes, and the control electrode forms a base electrode electrically connected with the partial region of the first diffusion region, thereby forming a vertical-type bipolar transistor.

10. A transistor device according to claim 5, wherein the partial region of the semiconductor substrate comprises a first substrate bottom layer of a high impurity concentration electrically connected to the first electrode and at least a second substrate bottom layer of a low impurity concentration disposed on the first substrate bottom layer.

11. A transistor device according to claim 10, wherein the probe region comprises a third diffusion region of the first conductivity type diffused at a predetermined depth in the partial region of the substrate region under the probe electrode and has a higher impurity concentration than that of the second substrate bottom layer.

12. A transistor device according to claim 6, wherein the probe region is defined in a shield region of the second conductivity type spaced from the first diffusion region, said probe region being diffused from the surface area in the partial region of the semiconductor substrate and electrically connected to the second electrode.

13. A vertical-type transistor device with means for detecting a voltage signal representative of current flow through the device, comprising:
  a semiconductor substrate of a first conductivity type having an upper layer region with a low impurity concentration and defining an upper surface with upper electrodes thereon, and having a lower layer region with a high impurity concentration and defining a lower surface with a lower electrode thereon;
  first diffusion regions of a second conductivity type diffused into the upper layer region from the upper surface leaving a partial region of the upper layer region between the first diffusion regions and the lower layer region;
  second diffusion regions of the first conductivity type diffused into the first diffusion regions from the upper surface leaving a partial region of the first diffusion regions around the second diffusion regions, respectively, the lower layer regions and the second diffusion regions being in electrical contact with the lower and upper electrodes, respectively;
  means for controllably causing electric current to flow through the second diffusion regions, the partial region of the first diffusion regions, the partial region of the upper layer region and the lower layer region between the first and the second electrodes;
  a probe region of the first conductivity type and with an impurity concentration higher than that of the upper layer region, the probe region being diffused into the upper layer region from the upper surface between the first diffusion regions and having a surface exposed in the upper surface of the substrate; and
  a probe electrode in electrical contact with and disposed on the exposed surface of the probe region, whereby the probe region and the probe electrode form the voltage signal detecting means for detecting the voltage signal through a part of the upper layer region between the first diffusion regions.

14. A semiconductor device with means for detecting current flow through the device, comprising:
  a semiconductor substrate of a first conductivity type having first and second surfaces with collector and emitter electrodes, respectively;
  a first diffusion layer of a second conductivity type formed in a predetermined region on the second surface side in the semiconductor substrate;
  a second diffusion layer of the first conductivity type formed in the first diffusion layer of the second conductivity type and electrically connected to the emitter electrode;
  a base electrode electrically connected to the first diffusion layer of the second conductivity type, thereby configuring a vertical bipolar transistor;
  means for causing electric current to flow between the collector and emitter electrodes though the first and second diffusion layers; and
  means for detecting the electric current comprising a probe region of a third diffusion layer of the first conductivity type formed in a portion of the second surface side of the substrate, and a probe electrode spaced from the first diffusion layer of the second conductivity type on the second surface side of the substrate and in electrical contact with the probe region, said probe electrode detecting a collector-emitter current of said transistor.

15. A vertical MISFET device with means for detecting a voltage signal representative of current flow through the device, comprising:
  a semiconductor substrate of a first conductivity type having first and second surfaces with drain and source electrodes, respectively;
  a region diffusion layer of a second conductivity type diffused from the second surface into said substrate;
  a shield diffusion layer of said second conductivity type diffused from the second surface into said substrate so that a partial portion remains of said first conductivity type between said diffusion layer and said shield diffusion layer on the second surface in the semiconductor substrate;
  a source diffusion layer of the first conductivity type diffused from the second surface in the region diffusion layer leaving a first channel between said source diffusion layer and said partial portion near the second surface of the substrate;
  voltage signal detecting means for detecting a voltage signal representative of current flow, said voltage signal detecting means comprising:
    a shield electrode disposed over said second surface and electrically connected to said shield diffusion layer and said source electrode, a probe diffusion layer of the first conductivity type diffused from the second surface in the shield diffusion layer leaving a second channel between said probe diffusion layer and said partial portion near the second surface of the substrate, and a probe electrode disposed over said second surface and electrically connected to said probe diffusion layer; and gate electrode means for electrically controlling the first and the second channels, said gate electrode means comprising a gate electrode disposed above an insulating film and partially over the source and probe diffusion layers, said insulating film disposed on the substrate second surface and partially over the source and probe diffusion layers, said gate electrode means thereby controlling a drain-source current of said vertical MISFET flowing through said first channel and said voltage signal representative of current flowing through said second channel.

* * * * *